(12) United States Patent
Uchida

(10) Patent No.: US 6,919,644 B2
(45) Date of Patent: Jul. 19, 2005

(54) SEMICONDUCTOR DEVICE MANUFACTURING METHOD AND SEMICONDUCTOR DEVICE MANUFACTURED THEREBY

(75) Inventor: Shotaro Uchida, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/891,316

(22) Filed: Jun. 27, 2001

(65) Prior Publication Data

US 2002/0033541 A1 Mar. 21, 2002

(30) Foreign Application Priority Data

Sep. 21, 2000 (JP) ........................................ 2000-287385

(51) Int. Cl.[7] .............................................. H01L 21/44
(52) U.S. Cl. ...................... 257/784; 257/781; 257/782; 257/672; 257/734; 257/779; 257/676; 257/670; 257/692; 257/723; 257/724; 257/288; 257/773; 257/776; 257/775; 257/666; 257/674
(58) Field of Search ................................ 257/773, 776, 257/775, 666, 674, 692, 723, 724, 288, 781, 784, 782, 672, 734, 735, 676, 670

(56) References Cited

U.S. PATENT DOCUMENTS 5,334,803 A    8/1994   Yamamura et al.
5,468,993 A   11/1995   Tani
5,567,656 A   10/1996   Chun
5,859,471 A  * 1/1999   Kuraishi et al. ............. 257/666
5,925,926 A  * 7/1999   Watanabe .................... 257/668
6,144,093 A  * 11/2000  Davis et al. ................. 257/723
6,229,205 B1 * 5/2001   Jeong et al. ................. 257/676

FOREIGN PATENT DOCUMENTS

JP          59-27559        2/1984
JP         11-297916       10/1999
JP         2000-114553      4/2000

* cited by examiner

*Primary Examiner*—Eddie Lee
*Assistant Examiner*—Junghwa Im
(74) *Attorney, Agent, or Firm*—Oblon, Spivak, McClelland, Maier & Neustadt, P.C.

(57) ABSTRACT

A method of manufacturing a semiconductor device involves mounting a semiconductor chip, formed on top with a main electrode and a subelectrode smaller in area than the main electrode, on a die pad of an external lead frame through a first bonding material, mounting an inner lead frame in which plural inner leads for connecting the main electrode and the subelectrode on the chip to corresponding connecting pads of the external lead frame are joined together by a tie bar on the chip and the external lead frame through a second bonding material, heating the first and second bonding materials simultaneously for electrically connecting and fixing the chip to the die pad and the inner leads to the electrodes on the chip and the connecting pads of the external lead frame, and cutting the tie bar to separate the inner lead frame into the plural inner leads.

13 Claims, 5 Drawing Sheets

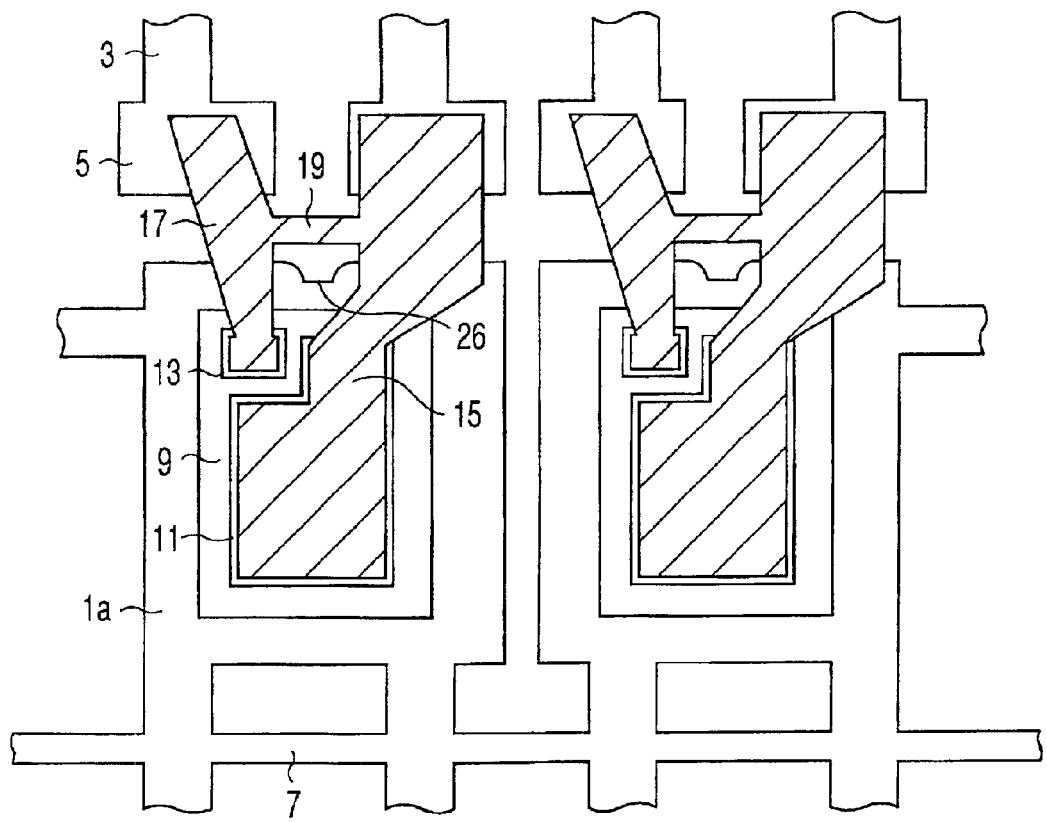
FIG. 3
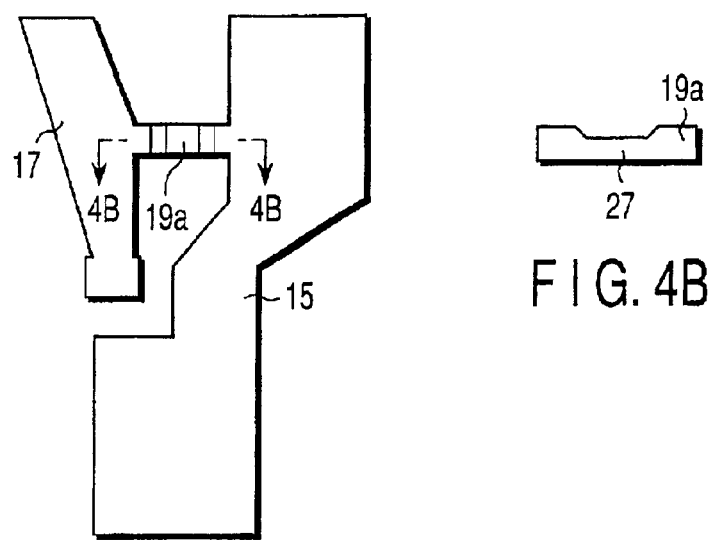
FIG. 4A
FIG. 4B

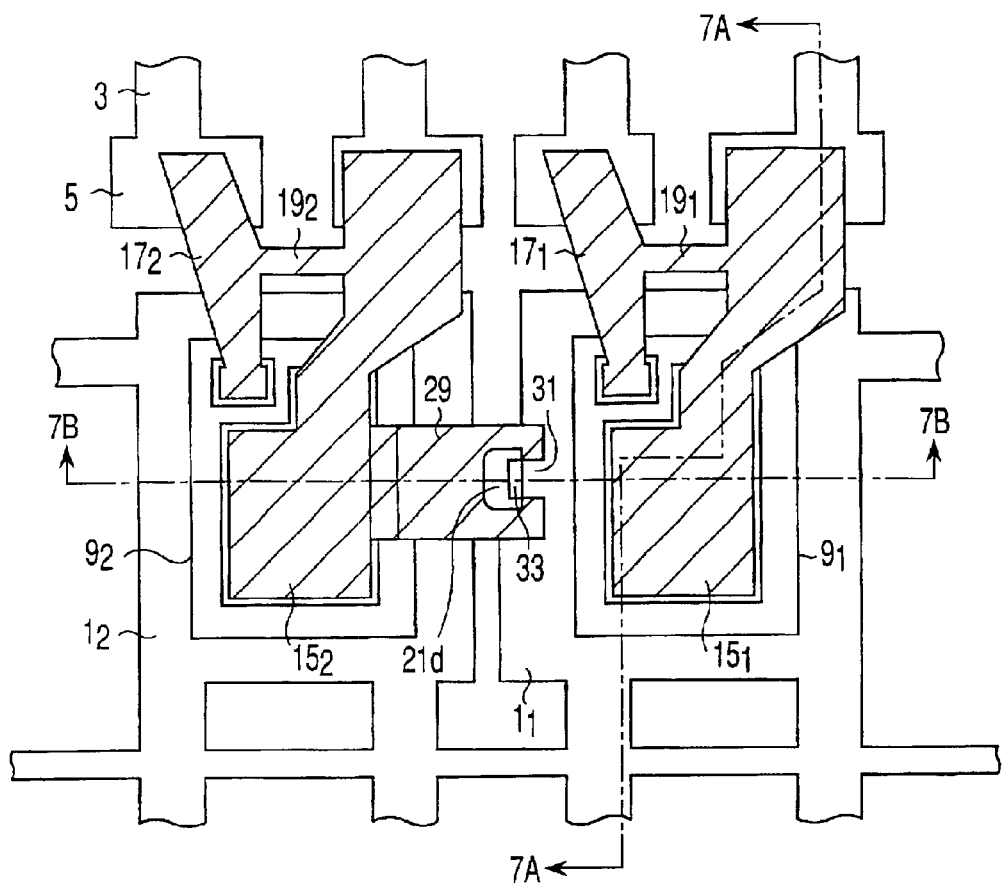
F I G. 7A
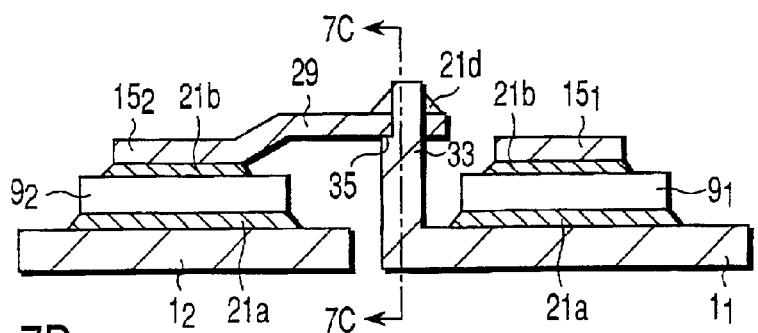
F I G. 7B
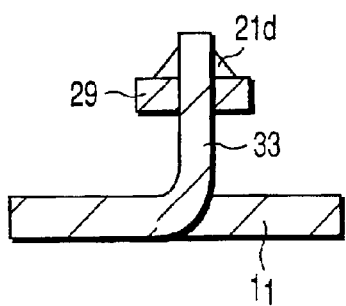
F I G. 7C

SEMICONDUCTOR DEVICE MANUFACTURING METHOD AND SEMICONDUCTOR DEVICE MANUFACTURED THEREBY

CROSS-REFERENCE TO RELATED APPLICATIONS

This application is based upon and claims the benefit of priority from the prior Japanese Patent Application No. 2000-287385, filed Sep. 21, 2000, the entire contents of which are incorporated herein by reference.

BACKGROUND OF THE INVENTION

The present invention relates to a method of manufacturing semiconductor devices and a semiconductor device manufactured by the method.

With the recent spread of portable electronic devices, the demand has increased for scaling down the dimensions of, reducing the weight of, and enhancing the performance of semiconductor packages. Heretofore, electrodes on top of semiconductor chips are connected to external leads by means of wire bonding. Two-terminal devices, such as diodes, are connected through internal leads to external leads by means of soldering.

With three-terminal devices, such as power MOS FETs, which handle relatively high current, soldering connection is desirable; however, since a gate electrode formed on a chip are very small in comparison with a source electrode, soldering of internal leads can not be applied because of poor position precision. For this reason, a gate electrode is connected by means of a single bonding wire, while a source electrode is connected by means of multiple bonding wires for ensuring current capacity.

There is a method in which a gate electrode is connected by means of wire bonding which allows the use of a fine wire and a source electrode is connected by means of soldering favorable for heat radiation and on resistance. However, this method results in the increased cost of manufacture and manufacturing facility because different materials which involve different surface finishes for electrodes are used for the gate electrode and the source electrode. To be specific, a material suitable for wire bonding, say, Al, is used for the gate electrode and a material suitable for soldering, say, VNiAu, is used for the source electrode.

In many cases, two power MOSFETs are connected in series. Conventionally, this series combination is made by wiring on a printed circuit board. With this approach, parasitic capacitance and resistance are associated with wiring, which may result in loss in performance.

BRIEF SUMMARY OF THE INVENTION

It is an object of the present invention to provide a method of connecting a semiconductor chip to external leads with ease of working and high reliability.

It is another object of the present invention to provide a semiconductor device obtained by the above method, particularly a semiconductor device in which two semiconductor chips can be connected in series within a semiconductor package through the use of the above connection method.

According to a first aspect of the present invention there is provided a method of manufacturing a semiconductor device comprising the steps of: mounting a semiconductor chip, which has a main electrode and a subelectrode smaller in area than the main electrode on an upper surface thereof, on a die pad of an external lead frame through a first bonding material; mounting an inner lead frame, in which a plurality of inner leads for connecting the main electrode and the subelectrode, on the semiconductor chip to corresponding connecting pads of the external lead frame are joined together by a tie bar on the semiconductor chip and the external lead frame through a second bonding material; heating the first and the second bonding material simultaneously for electrically connecting and fixing the semiconductor chip to the die pad and the inner leads to the electrodes on the semiconductor chip and the connecting pads of the external lead frame; and cutting the tie bar to separate the inner lead frame into the plurality of inner leads.

According to a second aspect of the present invention there is provided a semiconductor device comprising: a plurality of external leads; a die pad adjacent to the plurality of external leads; a semiconductor chip mounted on the die pad and having a main electrode and a subelectrode smaller in area than the main electrode; and two inner leads for connecting the main electrode and the subelectrode on the semiconductor chip to corresponding connecting pads of the plurality of external leads, the two inner leads having a tie bar cut.

According to a third aspect of the present invention there is provided a semiconductor device comprising: a plurality of external leads; a first and a second die pad placed side by side adjacent to the plurality of external leads; a first and a second semiconductor chip each having a main electrode and a subelectrode smaller in area than the main electrode; two pairs of inner leads for connecting the main electrode and the subelectrode on each of the first and the second semiconductor chip to corresponding connecting pads of the plurality of external leads, each pair of the inner leads having a tie bar cut; a protruding lead portion formed vertically on one side of the first die pad which faces the second die pad; and a connecting lead portion formed integrally with one of the inner leads which is connected to the main electrode on the second semiconductor chip mounted on the second die pad and having a notch engaged with the protruding lead portion so that the connecting lead portion and the protruding lead portion are electrically joined together.

According to the present invention, the use of the inner lead frame allows an inner lead to be solder bonded to a small electrode, such as a gate electrode, simultaneously with a soldering process for die mounting. Thus, the manufacturing process is simplified. The need of a wire bonding process using costly gold wires is eliminated, simplifying the manufacturing facilities.

The application of the present invention to a multi-chip package in which two or more semiconductor chips are molded allows the parasitic inductance and wiring resistance associated with a printed wiring board to be reduced and the device performance to be increased. Also, the packing density can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view of a semiconductor device according to a second embodiment of the present invention;

FIG. 4A is a plan view of an internal lead frame in a semiconductor device in accordance with a fourth embodiment of the present invention;

FIG. 4B is a sectional view taken along line 4B—4B of FIG. 4A;

FIG. 7A is a plan view for use in explanation of an internal connection method in a semiconductor device in accordance with a sixth embodiment of the present invention;

FIG. 7B is a sectional view taken along line 7B—7B of FIG. 7A;

FIG. 7C is a sectional view taken along line 7C—7C of FIG. 7B; and

DETAILED DESCRIPTION OF THE INVENTION

Figure 1A:
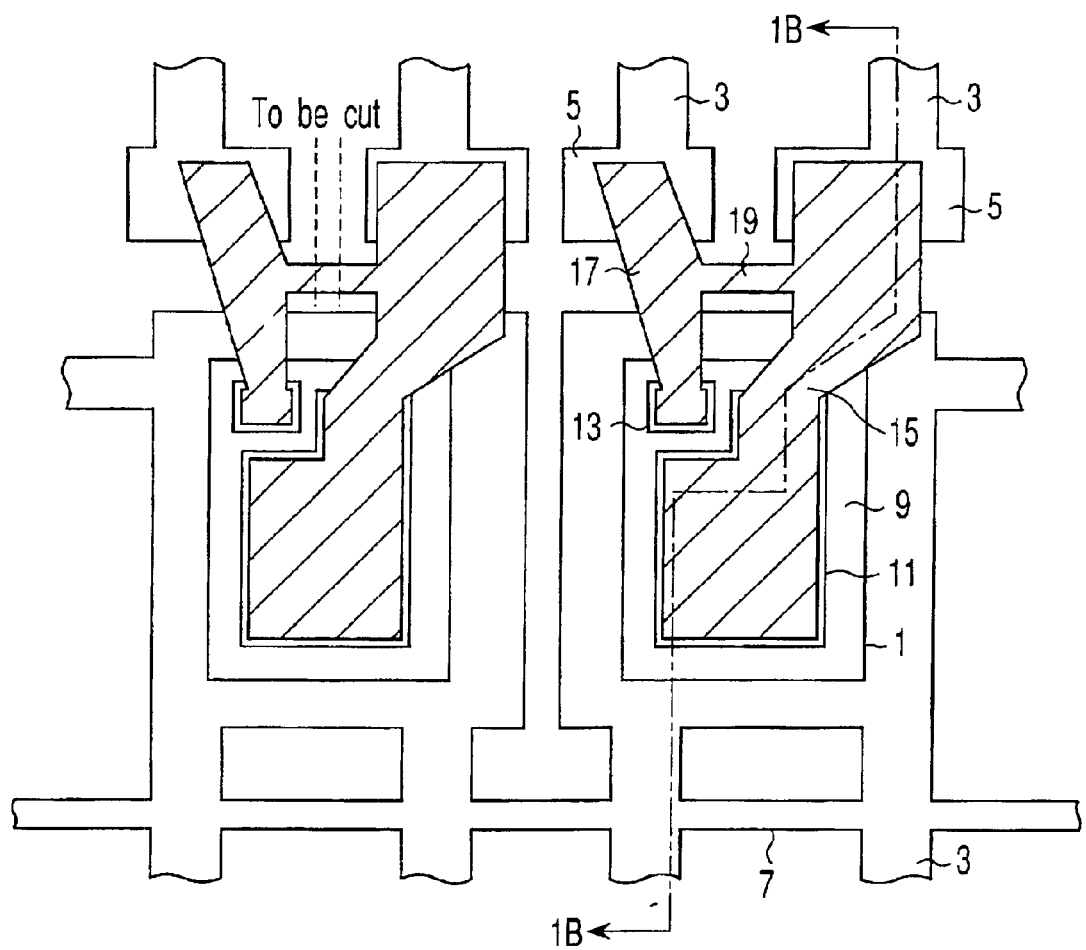
FIG. 1A is a plan view for use in explanation of an internal connection method in a semiconductor device in accordance with a first embodiment of the present invention.

A semiconductor device manufacturing method according to a first embodiment of the present invention will be described with reference to FIGS. 1A and 1B. FIG. 1A is a plan view illustrating the configuration in which a semiconductor chip is mounted on a lead frame and electrodes on the top of the semiconductor chip are electrically connected to external leads of the lead frame through inner leads, and FIG. 1B is a sectional view taken along line 1B—1B of FIG. 1A.

Figure 1B:
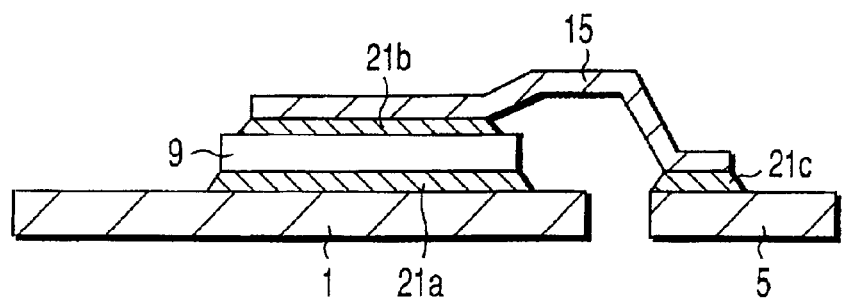
FIG. 1B is a sectional view taken along line 1B—1B of FIG. 1A.

In FIGS. 1A and 1B, reference numeral 1 denotes a die pad in the lead frame, 3 denotes an external lead of the lead frame, 5 denotes an inner lead connecting pad formed integrally with the external lead 3, and 7 denotes a tie bar adapted to form a well-known plastic seal lead frame, which is hereinafter referred to as the external lead frame for distinction from an internal lead frame to be described later.

To the die pad 1 of the external lead frame is attached a semiconductor chip 9 by a bonding material 21a which may be solder or conductive adhesive. The semiconductor chip 9, which includes, for example, an MOSFET, is formed on top with a source electrode (main electrode) 11 having a large area and a gate electrode (subelectrode) 13 having a small area and formed underneath with a drain electrode which is connected to the die pad 9 by the bonding material.

The first embodiment is characterized in that leads (inner leads) that connect the source electrode 11 and the gate electrode 13 to the external lead frame are composed of an inner lead frame consisting of a sheet metal. The inner lead frame is formed of a source electrode lead 15 and a gate electrode lead 17 and a tie bar 19 that joins these leads together. The tie bar 19 is cut to separate the source electrode lead 15 and the gate electrode lead 17 after the inner lead frame has been mounted. For easy cutting, the tie bar is provided to lie between adjacent external leads.

The inner lead frame is stamped from a sheet of, say, copper or copper alloy and then bent to conform to the surface levels of the chip and the external leads. In this case, the lead frame is formed so that the tie bar portion is above the chip surface, thereby ensuring easy cutting of the tie bar.

The inner lead frame is supplied in a form such that sets of inner leads (sets of the source electrode lead 15 and the gate electrode lead 17) are joined together by frames 23 through bridging bars 25. Immediately before being connected to the chip electrodes and the external lead frame, each bridging bar is cut at the side of the corresponding electrode lead. Each individual inner lead frame has chip pads 15a and 17a to be connected to the source electrode 11 and gate electrode 13, respectively, on the chip, and lead pads 15b and 17b to be connected to the external leads. The chip pads 15a and 17a are connected to the chip electrodes 11 and 13, respectively, by a bonding material 21b, while the lead pads 15b and 17b are connected to the external lead connecting pads 5 by a bonding material 21c. The bonding materials 21b and 21c, composed of solder or conductive adhesive, are preferably the same as the bonding material 21a used for die mounting. Depending on requirements, different materials may be used.

The manufacturing process of the lead configuration shown in FIGS. 1A and 1B will be described next. First, an appropriate amount of creamy solder (soldering paste) is applied onto the die pad 1 of the lead frame and the pads 5 of the external leads through the use of a dispenser. Instead of the dispenser method, a printing method may be used.

Next, the semiconductor chip 9 is mounted on the die pad 11 of the lead frame through the use of a die mounter. Afterward, an appropriate amount of soldering paste is applied onto the source electrode 11 and the gate electrode 13 of the chip through the use of a dispenser. The same soldering paste can be used for die mounting and lead mounting.

Next, one set of the source electrode lead 15 and the gate electrode lead 17 is disconnected from the frame 23 and then mounted in place on the semiconductor chip and the external lead frame.

Figure 2:
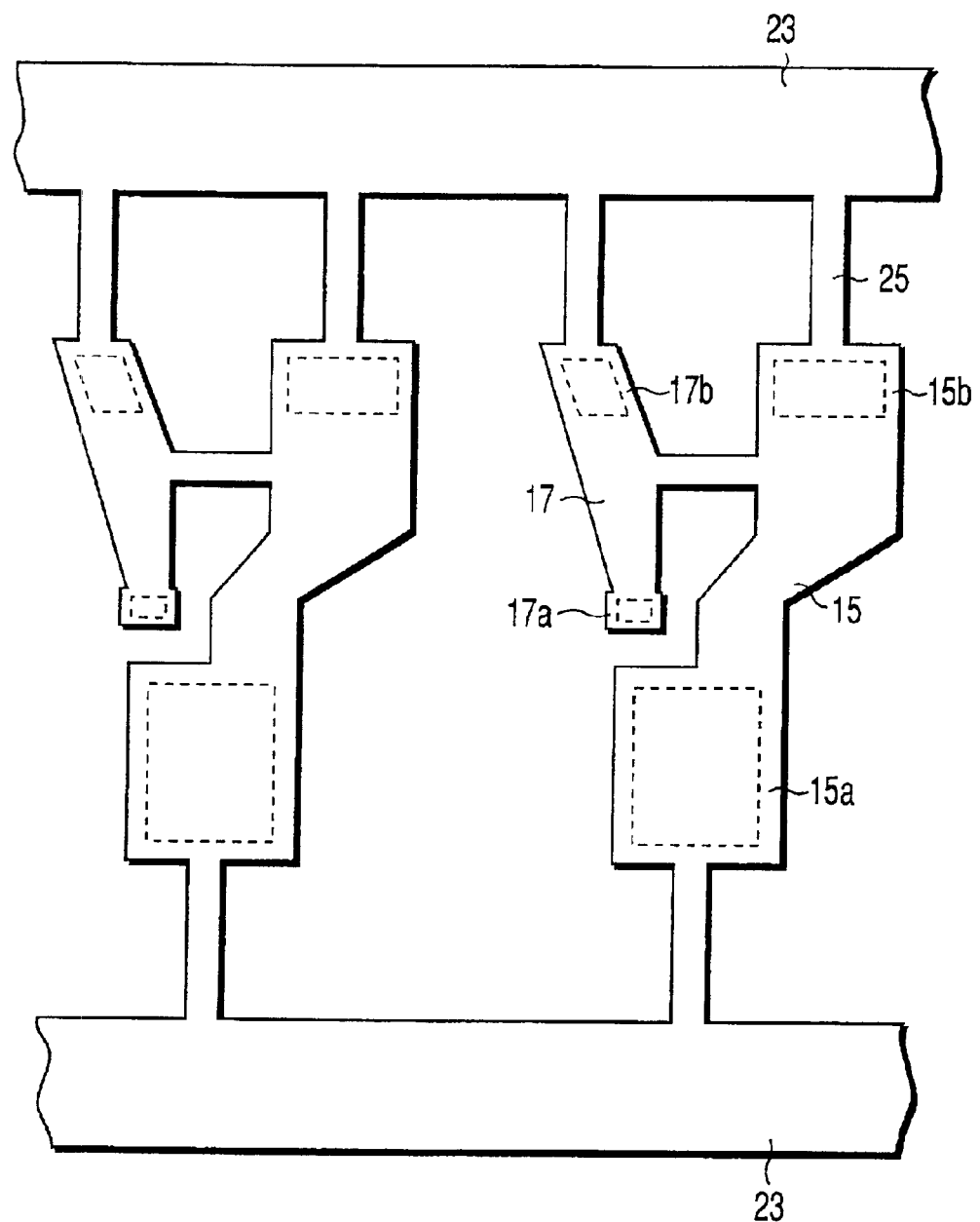
FIG. 2 is a plan view of an internal lead frame in the first embodiment.

Instead of applying the soldering paste to the source electrode 11 and gate electrode 15 on the chip, the soldering paste may be printed beforehand on the chip pads 15a and 17a and the lead pads 15b and 17b of the inner lead frame as shown dotted in FIG. 2.

Next, the mounted lead frame is placed in a solder reflow furnace to perform reflow soldering. The reflow furnace may be a belt conveyor type continuous furnace or a static type reflow furnace. Thereby, the solder 21a for die mounting and the solder 21b, 21C for inner lead mounting are simultaneously subjected to the reflow soldering.

Even with conductive adhesive, it can be applied through a dispenser or printing and solidified through a heating process similar to reflow.

Then, the tie bar 19 of the inner lead frame is cut with a cutter to separate the source electrode lead 15 and the gate electrode lead 17. Since the tie bar is set higher than the top of the semiconductor chip 19, it is easy to put the cutter to the tie bar without touching the chip.

After that, the lead frame is subjected to a resin molding process and the tie bar 7 of the external lead frame 3 is cut after molding, thus finishing a sealed semiconductor device.

The inner lead frame of the present invention has four supporting points, providing stabilization at the time of mounting and improved positioning precision. With conventional methods, wire bonding is required after die mounting. In contrast, in the invention, the inner lead frame is mounted after die mounting, and the chip and the inner lead frame are then subjected simultaneously to a solder reflow process, reducing manufacturing steps. In addition, the manufacturing cost can be reduced because of no use of costly gold wires.

[Second Embodiment]

A second embodiment of the present invention is basically the same as the first embodiment except for the shape of the die pads.

FIG. 3 is a plan view illustrating the inner connections in a semiconductor device according to the second embodiment of the present invention. Like reference numerals are used to denote corresponding parts to those in FIG. 1A and descriptions thereof are omitted. The same is true of still other embodiments.

The second embodiment is characterized in that, as shown in FIG. 3, the die pad 1a is formed with a notch 26 in its portion close to the tie bar 19 of the inner lead frame. The notch allows easy cutting of the tie bar.

[Third Embodiment]

FIG. 4A is a plan view of an inner lead according to a third embodiment of the present invention and FIG. 4B is an enlarged section view of the tie bar taken along line 4B—4B of FIG. 4A. In the second embodiment, as shown in FIG. 4B, the cutting portion 27 of the tie bar 19a is set smaller in thickness than the inner lead, thereby allowing easy cutting of the tie bar. For example, the thickness of the inner lead is set to 0.3 mm and the thickness of the cutting portion is set to 0.15 mm.

[Fourth Embodiment]

Figure 5:
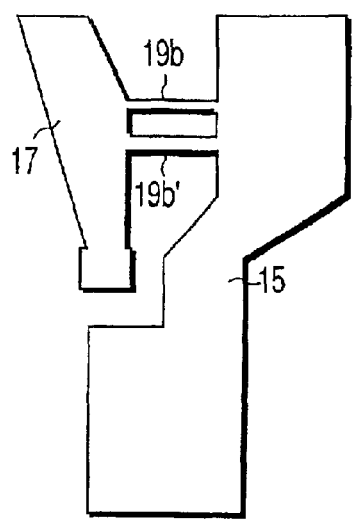
FIG. 5 is a plan view of an internal lead frame in a semiconductor device in accordance with a fifth embodiment of the present invention.

A fourth embodiment of the present invention is directed to a further variant of the inner lead frame. FIG. 5 is a plan view of an inner lead according to the fourth embodiment of the present invention. The tie bar is composed of two tie bar portions 19b and 19b'. This allows the stiffness of the tie bar to be increased, preventing the relative deformation of the source electrode lead 15 and the gate electrode lead 17, for example, one of the leads being twisted with respect to the other.

The tie bar portions 19b and 19b' may each be partly made small in thickness as in FIG. 4B for easy cutting.

[Fifth Embodiment]

Figure 6:
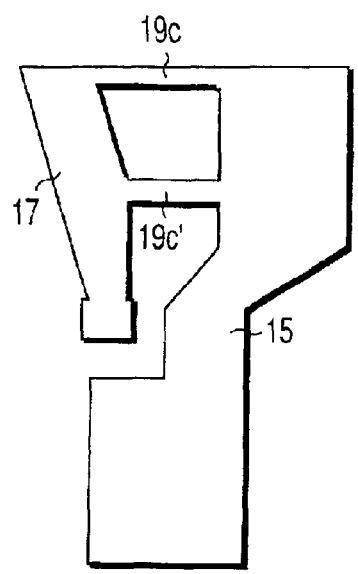
FIG. 6 is a plan view of an internal lead frame in a semiconductor device in accordance with a fifth embodiment of the present invention.

A fifth embodiment of the present invention is directed to a further variant of the inner lead frame. FIG. 6 is a plan view of an inner lead according to the fifth embodiment of the present invention. The tie bar is composed of two tie bar portions 19c and 19c'. The fifth embodiment differs from the fourth embodiment in that the tie bar portion 19c is provided in the vicinity of the inner lead connecting pads 5 of the external lead frame 3. As with the fourth embodiment, in the fifth embodiment, the stiffness of the inner lead frame can be increased. As in the case of FIG. 4B the tie bar portions 19c and 19c' may each be partly made small in thickness for easy cutting.

[Sixth Embodiment]

FIG. 7A is a plan view illustrating a lead connection method in a semiconductor device in accordance with a sixth embodiment of the present invention, and FIG. 7B is a sectional view taken along line 7B—7B of FIG. 7A. In the sixth embodiment, two semiconductor chips are mounted side by side on a lead frame and then molded as one package after inner lead connections. The sectional view taken along line A—A of FIG. 7A is the same as in FIG. 1B. The sectional view taken along line 7C—7C of FIG. 1B is illustrated in FIG. 7C.

The two semiconductor chips $9_1$ and $9_2$ shown in FIGS. 7A and 7B are die mounted and then connected to the corresponding external lead frames through the inner lead frames described in the first through fifth embodiments. In the sixth embodiment, the first inner lead frame in the right-hand portion of FIG. 7A differs in shape from the second inner lead frame in the left-hand portion. As the first inner lead frame, the inner lead frame of the first embodiment is used; instead, the inner lead frame of the third or fourth embodiment may be used.

The second die pad $1_2$ shown in the left-hand portion differs in shape from the first die pad $1_1$ shown in the right-hand portion. As the second die pad $1_2$, the die pad of the second embodiment may be used.

The first die pad $1_1$ has its one side facing the second die pad 12 stripped up to its middle and processed to erect. The erected strip forms a protruding lead 33.

The source electrode (main electrode) lead of the second inner lead frame has a lead portion 29 that extends toward the first chip and has its tip formed with a notch 31 with which the protruding lead 33 of the first chip mounted die pad is engaged. The lead portion 29 of the source electrode lead of the first chip is supported by a step (flat portion) 35 of the protruding lead 33 which is formed just below its top. This structure allows the second inner lead frame to be supported with stability. The lead portion 29 of the second inner lead frame and the protruding lead 33 of the first die pad are joined together with solder 21d in their engaged portion.

Next, the manufacturing process of the semiconductor device of the sixth embodiment will be described. First, an appropriate amount of, for example, soldering paste is applied to the die pads $1_1$ and $1_2$ of the external lead frame and the pads 5 of the external leads to which the inner leads are to be connected through the use of a dispenser. Instead of the dispenser method, the printing method may be used.

Next, semiconductor chips $9_1$ and $9_2$ are mounted on the die pads $1_1$ and $1_2$, respectively, through the use of a die mounter. Afterward, an appropriate amount of soldering paste is applied to the source electrodes $11_1$ and $11_2$ and the gate electrodes $13_1$ and $13_2$ of the chips through the use of dispenser. The same soldering paste can be used for die mounting and lead mounting.

Next, one set of the source electrode lead $15_1$ and the gate electrode lead $17_1$ for the first chip is disconnected from the frame 23 (shown in FIG. 2) and then mounted in place on the electrodes on the semiconductor chip and the pads of the external lead frame. Subsequently, one set of the source electrode lead $15_2$ and the gate electrode lead $17_2$ for the second chip is disconnected from the frame 23 and then mounted in place on the semiconductor chip and the external lead frame. At this point, the notch 31 of the lead portion 29 of the second inner lead frame is set to engage with the protruding lead 33 of the first inner lead frame and rest on the step 35 of the protruding lead 33. Then, soldering paste 21d is applied, using the dispenser, to the place where the lead portion 29 and the protruding lead 33 are engaged with each other.

Next, the external lead frame on which the chip and the inner lead frame have already be mounted is placed in a solder reflow furnace to perform reflow soldering. The reflow furnace may be a belt conveyor type continuous furnace or a static type reflow furnace. Thereby, the solder 21a for die mounting, the solder 21b, 21C for inner lead mounting and the solder 21d for connecting the leading potion 29 to the first die pad $1_1$ are simultaneously subjected to a reflow operation.

After that, the same process as in the first embodiment is performed, thereby finishing a sealed semiconductor device. Instead of using soldering paste, conductive adhesive may be used.

In order to connect the lead portion 29 to the first die pad $1_1$, one might suggest forming the tip of the lead portion downward and directly soldering it to the first die pad $1_1$. This would cause the solder therefor to fuse into the chip mounting solder and hence adversely affect the thickness of the chip mounting solder and the parallelism of the chip. In contrast, in the present embodiment, the use of the protruding lead 33 allows the place where the leading portion 29 and the first die pad $1_1$ are soldered together to keep away from the chip, thus avoiding such problems.

Figure 8:
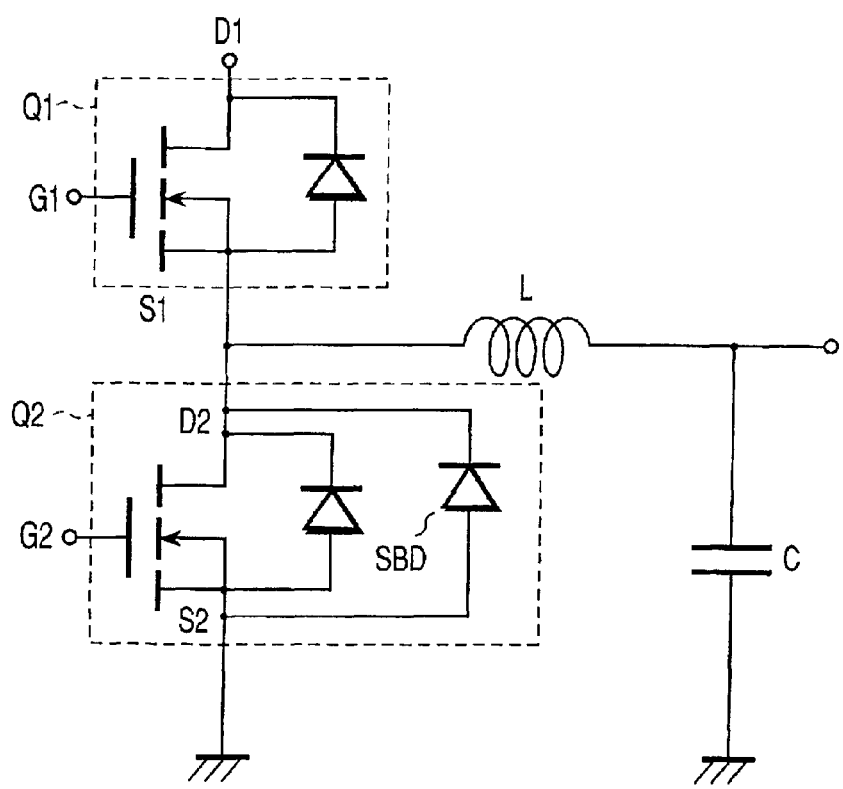
FIG. 8 is a circuit arrangement of a synchronous rectifying circuit to which the sixth embodiment is adaptable.

The package of the sixth embodiment is effectively applied to part of such a synchronous rectifier as shown in FIG. 8. In FIG. 8, Q1 is a power MOSFET. A diode connected in parallel with the FET Q1 is a parasitic diode. An FET Q2 connected in series with Q2 is a power MOSFET with a Schottky barrier diode SBD and a parasitic diode in the same chip are connected in parallel. To the node between the source S1 of Q1 and the drain D2 of Q2 is connected a series combination of an inductor L and a capacitor C as a load. The Schottky barrier diode SBD is intended to provide a current path when the transistor Q1 is off.

The application of Q2 and Q1 to the sixth embodiment as the first and second semiconductor chips allows part of the synchronous rectifier to be formed into one package. This allows the parasitic inductance and the wiring resistance to be reduced, improving the device performance and the packing density.

Although the preferred embodiments of the invention have been described, it is apparent that other embodiments and modifications are possible. For example, the sixth embodiment, which has been described in terms of two chips, can be applied to three or more chips.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a plurality of external leads;

a die pad adjacent to the plurality of external leads;

a semiconductor chip mounted on the die pad and having a main electrode and a subelectrode smaller in area than the main electrode;

two inner leads configured to connect the main electrode and the subelectrode on the semiconductor chip to corresponding connecting pads of the plurality of external leads, respectively, the two inner leads each having a portion of a cut remainder of a tie bar.

2. The semiconductor device according to claim 1, wherein the tie bar is made smaller in thickness than other portions of the inner leads.

3. The semiconductor device according to claim 1, wherein the tie bar is provided midway on and between the external leads to which the two inner leads are connected.

4. The semiconductor device according to claim 1, wherein the tie bar comprises a plurality of sub tie bars connecting between the two inner leads and arranged separately.

5. The semiconductor device according to claim 1, wherein the die pad has a notch in a portion that faces a longitudinal side of the tie bar.

6. The semiconductor device according to claim 1, wherein the two inner leads have tie bar portions thereof formed higher than a top of the semiconductor chip.

7. The semiconductor device according to claim 1, wherein the semiconductor chip includes a MOSFET.

8. A semiconductor device comprising:

a plurality of external leads;

a first and a second die pad placed side by side adjacent to the plurality of external leads;

a first and a second semiconductor chip each having a main electrode and a subelectrode smaller in area than the main electrode;

two pairs of inner leads configured to connect the main electrode and the subelectrode on each of the first and the second semiconductor chip to corresponding connecting pads of the plurality of external leads, respectively, each pair of the inner leads having a portion of a cut remainder of a tie bar;

a protruding lead portion formed vertically on one side of the first die pad which faces the second die pad; and a connecting lead portion formed integrally with one of the inner leads which is connected to the main electrode on the second semiconductor chip mounted on the second die pad and having a notch engaged with the protruding lead portion so that the connecting lead portion and the protruded lead portion are electrically joined together.

9. The semiconductor device according to claim 8, wherein the protruding lead portion has a flat portion in an upper portion thereof which supports the connecting lead portion.

10. The semiconductor device according to claim 8, wherein each of the first and the second semiconductor chip includes a MOSFET and the first semiconductor chip further includes a Schottky diode connected in parallel with the MOSFET.

11. The semiconductor device according to claim 8, wherein the tie bar is made smaller in thickness than other portions of the inner leads.

12. The semiconductor device according to claim 8, wherein the tie bar is provided midway on and between the external leads to which the two inner leads are connected.

13. The semiconductor for device according to claim 8, wherein the die pad has a notch in a portion that faces a longitudinal side of the tie bar.

* * * * *